United States Patent
Fastow et al.

(10) Patent No.: US 7,217,964 B1
(45) Date of Patent: May 15, 2007

(54) METHOD AND APPARATUS FOR COUPLING TO A SOURCE LINE IN A MEMORY DEVICE

(75) Inventors: Richard M. Fastow, Cupertino, CA (US); Kuo-Tung Chang, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 163 days.

(21) Appl. No.: 10/658,937

(22) Filed: Sep. 9, 2003

(51) Int. Cl.
*H01L 27/10* (2006.01)

(52) U.S. Cl. .................. 257/208; 257/202; 257/203; 257/314

(58) Field of Classification Search ............... 257/314, 257/315, 202, 203, 208
See application file for complete search history.

(56) References Cited

U.S. PATENT DOCUMENTS 6,765,257 B1 * 7/2004 Mehrad et al. ............. 257/314

* cited by examiner

*Primary Examiner*—Douglas M. Menz

(57) ABSTRACT

A method and apparatus for coupling to a source line. Specifically, embodiments of the present invention disclose a memory device comprising an array of flash memory cells with a source line connection that facilitates straight word lines, and a method for producing the same. The array is comprised of a plurality of non-intersecting shallow trench isolation (STI) regions that isolate a plurality of memory cell columns. A source column implanted with n-type dopants is also isolated between an adjoining pair of STI regions. The source column is coupled to a plurality of common source lines that are coupled to a plurality of source regions in the array. A source contact is coupled to the source column for providing electrical coupling with the plurality of source regions. The source contact is located along a row of drain contacts that are coupled to drain regions of a row of memory cells.

7 Claims, 11 Drawing Sheets

METHOD AND APPARATUS FOR COUPLING TO A SOURCE LINE IN A MEMORY DEVICE

TECHNICAL FIELD

The present invention relates to the field of semiconductor memory devices. Specifically, the present invention relates to a nonvolatile semiconductor memory device including a NOR type array of flash memory cells exhibiting straight word lines.

BACKGROUND ART

A flash or block erase memory (flash memory), such as. Electrically Erasable Programmable Read-Only Memory (Flash EEPROM), includes an array of cells which can be independently programmed and read. The size of each cell and thereby the memory as a whole are made smaller by eliminating the independent nature of each of the cells. As such, all of the cells are erased together as a block.

A memory of this type includes individual Metal-Oxide Semiconductor (MOS) memory cells that are field effect transistors (FETs). Each FET, or flash, memory cell includes a source, drain, floating gate and control gate to which various voltages are applied to program the cell with a binary 1 or 0, or erase all of the cells as a block. Programming occurs by hot electron injection in order to program the floating gate. Erasure employs Fowler-Nordheim tunneling effects in which electrons pass through a thin dielectric layer, thereby reducing the amount of charge on the floating gate. Erasing a cell sets the logical value of the cell to "1," while programming a cell sets the logical value to "0." The flash memory cell provides for nonvolatile data storage.

Prior Art FIG. 1 illustrates a typical configuration of a plan view of a section of a memory array 100 in a NOR-type of configuration for a memory device. Prior Art FIG. 1 is not drawn to scale. As shown in Prior Art FIG. 1, the array 100 is comprised of rows 110 and columns 120 of memory cells. Each of the memory cells are isolated from other memory cells by insulating layers (e.g., a plurality of shallow trench isolation regions (STI) 150.

The control gates of each of the memory cells are coupled together in each of the plurality of rows 110 of memory cells, and form a plurality of word lines 130 that extend along the row direction.

Bit lines extend in the column direction and are coupled to drain regions via drain contacts 160 in an associated column of memory cells 120. The bit lines are coupled to drain regions of memory cells in associated columns of memory cells 120.

A plurality of source lines 140 extend in the row direction and are coupled to the source regions of each of the memory cells in the array of memory cells 100. One source line is coupled to source regions in adjoining rows of memory cells, and as a result, one source region is shared between two memory cells. Similarly, drain regions are shared amongst adjoining rows of memory cells, and as a result, one drain region is shared between two memory cells.

Each of a plurality of source contacts is coupled to the plurality of common source lines 140. Each of the plurality of source contacts 145 is formed in line with the associated common source line to which it is coupled. The source contacts are formed in a column 147, and may be connected with each other. The column 147 is isolated between two STI regions and forms a dead zone in which no memory cells are present.

As shown in FIG. 1, due to current photolithography limitations in forming contact vias, each of the plurality of source contacts 145 is larger than their associated common source lines 140. As a result, the common source lines 140 need to be widened in the region surrounding their associated source contacts 145. This is to accommodate the wider source contacts 145. As such, word lines one either side of the common source line 140 are bent to accommodate for the increased area for the common source line surrounding an associated source contact 145.

However, as the size of each memory cell and correspondingly, the array 100 itself is reduced, the bending of the word lines to accommodate for the size of the source contacts is limited by current photolithography and chemical vaporization deposition (CVD) techniques. For example, as the size shrinks, it becomes more difficult to form a pronounced bend in each of the plurality of word lines 130 at current pitches achievable by current photolithography techniques. As a result, the size of the overall array 100 is limited by the ability to bend the word lines 130.

Furthermore, the inability to form straight word lines in the region surrounding the source contacts 145 effects the uniformity of cells throughout the array 100. Specifically, the memory cells bordering the column 147 of source contacts that includes the source contacts 145 may have electrical characteristics (erase and program) that are different than those memory cells that do not border a column of source contacts. Voltage thresholds and current leakage are specific problems. In particular, a change in the erasing characteristics of a memory cell bordering the column 147 of source contacts can alter the threshold voltage of the cell into the negative region. This causes cell current to always flow (leakage) irrespective of the associated word line potential. As such, memory cells lying on the same bit line as the defective cell will have an erroneous state being read.

Thus, a need exists for a semiconductor memory device with better uniformity and performance uniformity between memory cells in an array of memory cells, thus leading to better fabrication yields. A further need exists for an array of memory cells that is more compact by extending beyond the size limitations due to source contact formation. An even further need exists for word line formation that can accommodate the decreasing size of the array of memory cells using current photolithography techniques.

DISCLOSURE OF THE INVENTION

The present invention provides a memory device with better uniformity between memory cells in an array of memory cells, leading to more compactness in the array of memory cells, and higher yields for the array. Also, the present invention provides for a method for forming word lines in an array of memory cells that is more easily fabricated using current photolithography techniques.

Specifically, embodiments of the present invention disclose a memory device comprising an array of flash memory cells with a source line connection that facilitates straight word lines, and a method for producing the same. In the apparatus, an array is comprised of a plurality of non-intersecting shallow trench isolation (STI) regions that isolate a plurality of memory cell columns, in one embodiment. A source column implanted with n-type dopants is also isolated between an adjoining pair of STI regions. As such, the array of memory cells is comprised of columns of memory cells and at least one column that is a source column.

The source column is permanently coupled to a plurality of common source lines in the array of memory cells. The plurality of common source lines is in turn coupled to a plurality of source regions in the array. A source contact is coupled to the source column for providing electrical coupling with the plurality of source regions. More particularly, the source contact is located along a row of drain contacts that are coupled to drain regions of a row of memory cells. The location of the source contact along a row of drain contacts facilitates a straight word line in a region near the source contact.

In another embodiment, a method for fabricating the memory device comprising an array of flash memory cells with a source line connection that facilitates straight word lines is disclosed. The method comprises forming a source column in an array of memory cells. The array comprises a plurality of memory cells arranged in a matrix of rows and columns. The array comprises a plurality of rows of drain contacts for accessing drain regions in associated rows of memory cells in the array.

A source contact is formed and coupled to the source column. The source contact is located in line with a selected row of drain contacts. The source column is coupled to a plurality of common source lines that are perpendicular to the source column. Each of the plurality of common source lines is coupled to a plurality of source regions in the array. The source contact is coupled to the source column for providing electrical coupling with the plurality of source regions in the array of memory cells.

BRIEF DESCRIPTION OF THE DRAWINGS

PRIOR ART

It is appreciated that FIGS. 1–8(A–D) are drawn for illustrative purposes only and are not drawn to scale.

BEST MODES FOR CARRYING OUT THE INVENTION

Reference will now be made in detail to the preferred embodiments of the present invention, a semiconductor memory including a core memory array of memory cells with source line connections that facilitate straight word lines, and a method for producing the same. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, the present invention discloses a memory device with better uniformity of performance between memory cells in an array of memory cells, more compactness in the array of memory cells, and higher yields for the array. Also, the present invention discloses a method for forming source line connections that facilitate easier fabrication of straight word lines in an array of memory cells using current photolithography techniques.

Figure 1:
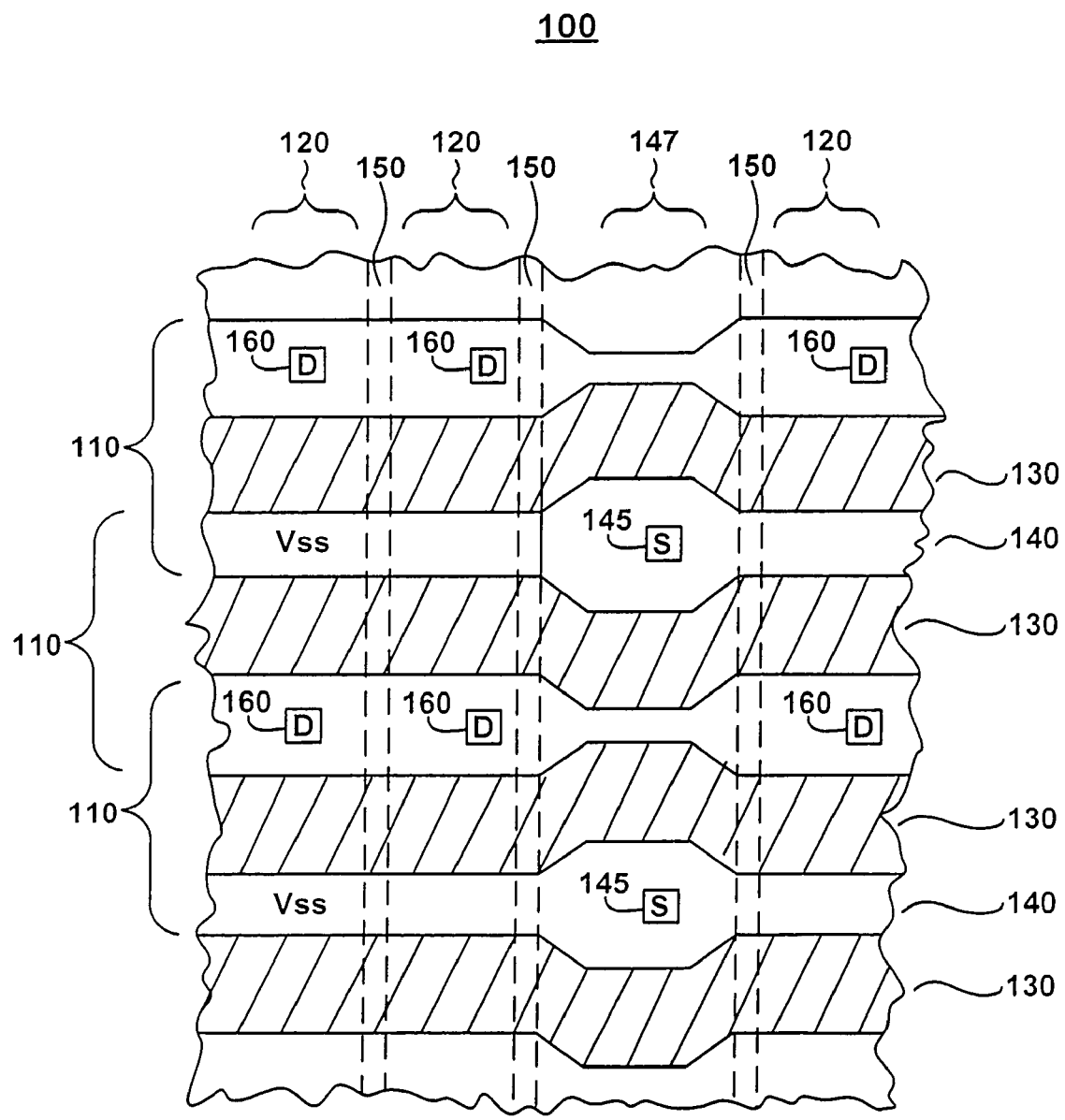
FIG. 1 is a planar view of a section of a core memory array of memory cells in a semiconductor memory.
Figure 2:
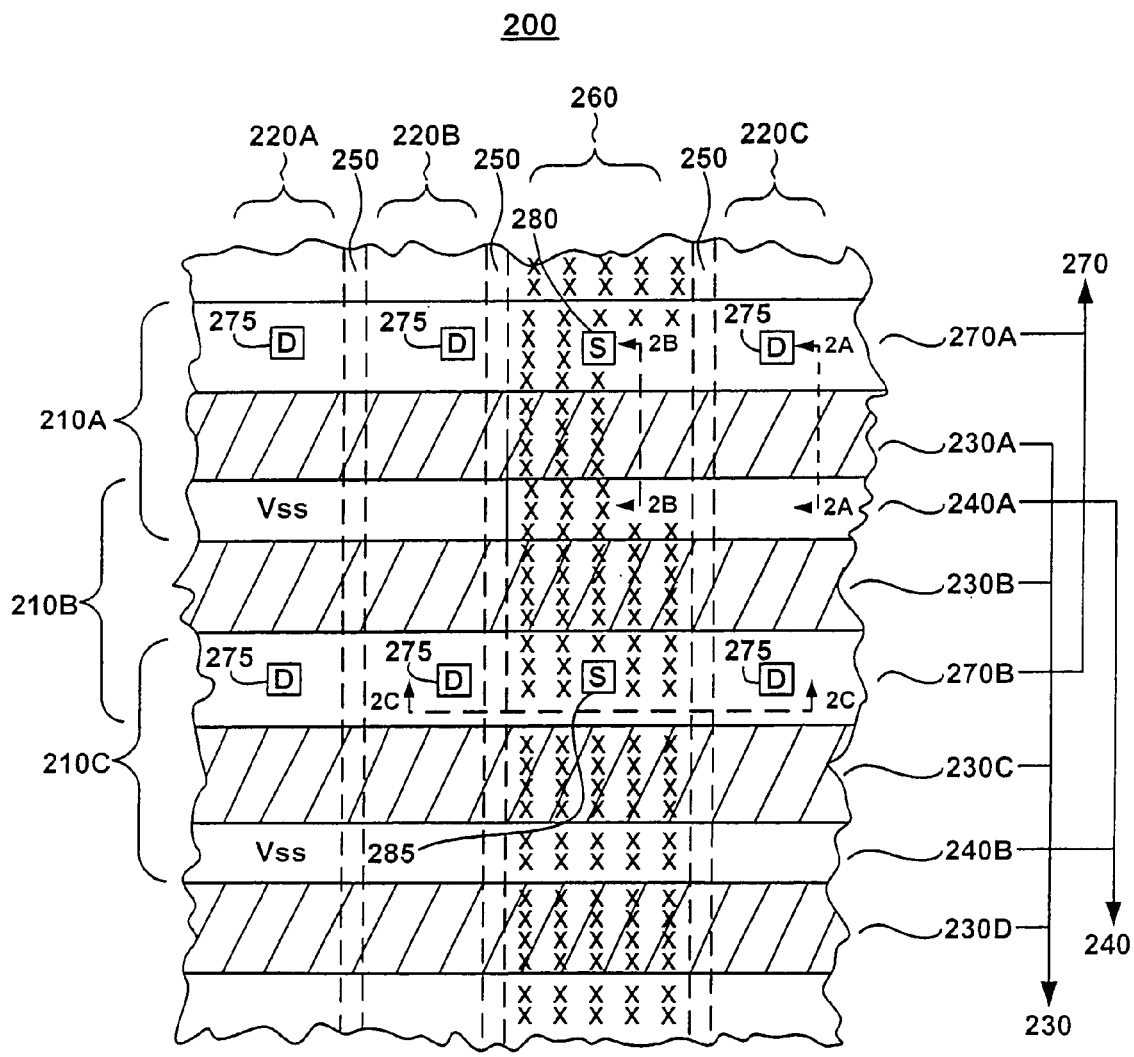
FIG. 2 is a planar view of a section of a core memory array of memory cells including a source column, in accordance with one embodiment of the present invention.

FIG. 2 is a planar view of a section of the core array of memory cells illustrating the formation of source line connections that facilitate the formation of straight word lines, in accordance with one embodiment of the present invention. As shown in FIG. 2, the array 200 comprises a plurality of rows 210 of memory cells (e.g., row 210A, 210B, 210C, etc.). The array 200 also comprises a plurality of columns 220 of memory cells (e.g., column 220A, 220B, 220C, etc.). Each of the memory cells are isolated from other memory cells by insulating layers. For example, a plurality of non-intersecting shallow trench isolation regions (STI) 250 isolate memory cells along the row direction, and a plurality of word lines 230 isolate memory cells in the column direction.

The control gates of each of the memory cells in the array 200 are coupled together in each of the plurality of rows 210 of memory cells, and form a plurality of word lines 230 that extend along the row direction, in accordance with one embodiment of the present invention. The plurality of word lines comprises word lines 230A, 230B, 230C, 230D, etc.

Bit lines (not shown) extend in the column direction and are coupled to drain regions of associated memory cells via a plurality of drain contacts 275 in associated columns of memory cells 220. As such, each of the bit lines is coupled to drain regions of memory cells in associated columns of memory cells 220.

A plurality of source lines 240 extend along the row direction and are coupled to source regions in each of the memory cells in the array of memory cells 200. The plurality of source lines 240 are comprised of source lines 240A, 240B, etc. as shown in FIG. 2. The source lines 240 are also referred to as $V_{ss}$ lines in some circles. In one embodiment, the plurality of source lines 140 is a plurality of common source lines. As such, the common source lines in the plurality of common source lines 140 are electrically coupled together.

In addition, one common source line is coupled to source regions in adjoining rows of memory cells, and as a result, one source region is shared between two memory cells. Similarly, drain regions are shared amongst adjoining rows of memory cells, and as a result, one drain region is shared between two memory cells in the column direction.

Also, as shown in FIG. 2, each of the rows of memory cells 210 has an associated row of drain contacts 270 in the plurality of rows of drain contacts comprised of rows 270A, 270B, etc. For example, row 210A is associated with the row 270A of drain contacts. Within the fabrication process, each of the drain contacts 275 are formed similarly and simultaneously to couple with the underlying drain regions of each of the memory cells in the array 200.

FIG. 2 is exemplary only, and the pattern of word lines, source lines, and bit lines can be altered for performance reasons. For example, each of the plurality of source lines 240 of FIG. 2 is a common source line, but could easily be formed as an unshared source line. In addition, the pattern of word lines, source lines, and bit lines coupled to the array of memory cells 200 is shown in a NOR type configuration. However, other embodiments are well suited to arrays of other logical configurations.

Importantly, FIG. 2 illustrates the formation of a source column 260 for providing electrical coupling to the source regions of each of the memory cells in the array 200, in accordance with one embodiment of the present invention. The source column 260 is implanted with n-type dopants, in general. Typical n-type dopants can be taken from a group consisting of arsenic, phosphorous, and antimony in one embodiment; however, other embodiments are well suited to any n-type dopants suitable for fabrication of core array of memory cells. As shown in FIG. 2, the source column 260 is formed perpendicular to each of the plurality of rows of memory cells 210, and in particular, to each of the plurality of common source lines 240.

The source column 260 is isolated between an adjoining pair 250A of the plurality of non-intersecting STI regions 250. As such, the source column 260 is electrically isolated from adjoining memory cells on either side of the adjoining pair 250A of STI regions. The source column 260 is also permanently coupled to a plurality of common source lines 240. As previously discussed, the plurality of common source lines 240 is coupled to a plurality of source regions in the array 200. As such, the source regions in the array 200 are electrically coupled to each other through the plurality of common source lines and the source column 260.

In addition, FIG. 2 illustrates the formation of a source contact 280 that is coupled to the source column 260. The source contact 280 provides for electrical coupling with each of the plurality of source regions in memory cells of the array 200 through the source column and the plurality of common source lines 240.

In one embodiment, the source contact is located along one of the plurality of rows 270 of drain contacts (e.g., row 270A of drain contacts). As such, the source contact 280 is formed similarly and simultaneously in the fabrication process as the plurality of drain contacts 275 in the row 270A of drain contacts. In one embodiment, the source contact 280 is of the same size and dimension as the drain contacts 275 in the associated row of drain contacts 270A. The source contact 280 provides for electrical coupling to the source column 260, and as such, to each of the source regions of memory cells in the array 200. In another embodiment, the source contact is of a different dimension than an associated row of drain contacts.

In another embodiment, a second source contact 285 is formed to couple with the source column 260. By strapping the source column 260 with a second source contact 285, the resistance in the plurality of common source lines 270 is reduced. The second source contact 285 is formed in a second row of drain contacts 270B that are coupled to drain regions of a second row of memory cells. In another embodiment, each of the plurality of rows of drain contacts 270 that is associated with the plurality of rows of memory cells 210 has a source contact formed in the source column 260.

The location of the source contact 280 along the row of drain contacts 270 enables the straight formation of a word line (e.g., 230A) that intersects the source column 260 near to the source contact 280. Instead of forming the source contact 280 in line with an associated $V_{ss}$ line (e.g., 240A) from the plurality of common source lines 240, the source contact is moved and formed along one of the plurality of rows of drain contacts 270 (e.g., row 270A). The drain contacts 270 of in each of the rows of memory cells 210 are arranged perpendicularly to the source column 260.

Since there is more space allowed to form the source contact (e.g., 280) along the row of drain contacts 270A than in one of the plurality of common source lines 240, each of the plurality of word lines 230 does not need to be adjusted, or bent, through photolithography techniques in order to accommodate for the source contact 280. As such, the word lines (e.g., word line 230A) that intersects the source column 260 on either side of the row of drain contacts 270A that includes the source contact 280 will maintain a uniform and straight formation in the fabrication process.

Similarly, by forming a plurality of source contacts (e.g., 280 and 285) in each of the plurality of rows of drain contacts 270, each of the plurality of word lines 240 that intersects the source column 260 near one of the plurality of source contacts can maintain a uniform and straight formation in the fabrication process. In addition, by locating the plurality of source contacts in the plurality of drain contacts 270, each of the plurality of rows of memory cells 210 is smaller than each of the plurality of rows of memory cells 110 of Prior Art FIG. 1. By locating the plurality of source contacts (e.g., 280 and 285) in the plurality of rows 270, the word lines do not require any bending.

In another embodiment, a second source column (not shown) is also implanted with n-type dopants and isolated between a second adjoining pair of the plurality of non-intersecting STI regions 250. The second source column is also coupled to the plurality of common source lines 240. In addition, source contacts are formed in the second source column similarly in the plurality of rows of drain contacts 270, as previously discussed. The second source column is located x columns of memory cells from the source column 260 as shown in FIG. 2 for reducing resistance in the plurality of common source lines. The number x can be any number, but typically is between 15 and 35.

Figure 3:
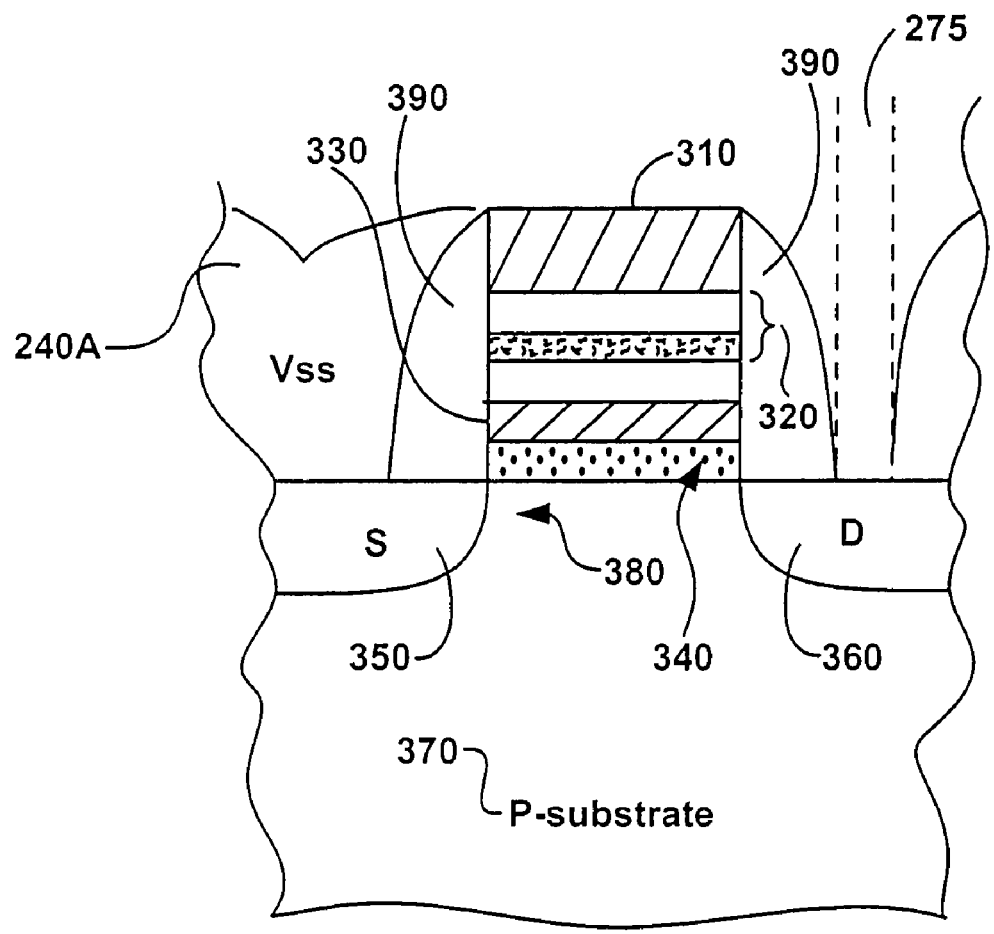
FIG. 3 is a cross sectional view of the core memory array of memory cells of FIG. 2 taken along line 2A—2A illustrating an exemplary semiconductor an exemplary semiconductor flash memory cell, in accordance with one embodiment of the present invention.

FIG. 3 is a cross sectional diagram of the array of memory cells 200 taken along line 2A—2A of FIG. 2, in accordance with one embodiment of the present invention. FIG. 3 illustrates the formation of flash memory cell in one embodiment; however, other embodiments can include the formation of additional types of memory cells. FIG. 3 is a cross-sectional diagram of flash memory cell 300 including a tunnel oxide dielectric 340. The tunnel oxide dielectric 340 is sandwiched between a conducting polysilicon floating gate 330 and a crystalline silicon semiconductor substrate 370 (e.g., a p-substrate). The substrate 370 includes a source region 350 and a drain region 360 that can be separated by an underlying channel region 380. A control gate 310 is provided adjacent to the floating gate 330, and is separated by an interpoly dielectric 320. Typically, the interpoly dielectric 320 can be composed of an oxide-nitride-oxide (ONO) structure. In one embodiment, the control gate 310 forms the word line 230A of FIG. 2.

The flash memory cell 300 can be adapted to form a p-channel flash memory cell or an n-channel flash memory cell depending on user preference, in accordance with embodiments of the present invention. Embodiments of the present inventions are well suited to implementation within a p-channel or n-channel flash memory cell. Appropriate changes in the FIGS. 2–5 are necessary to reflect implementation of p-channel or n-channel devices.

FIG. 3 also illustrates optional sidewall spacers 375 formed on either side of the flash memory cell 300 for insulating the stacked gate formation of the flash memory cell 300. FIG. 3 also illustrates the formation of the common source line 240A that is coupled to the source region 350 of the flash memory cell 300. The common source line 240A as shown in FIG. 3 is permanently coupled to a source column (e.g., source column 260 of FIG. 2). In addition, a drain contact 275 is shown that is one of an associated row of drain contacts 270A in an row 210A of memory cells that includes flash memory cell 300.

Figure 4:
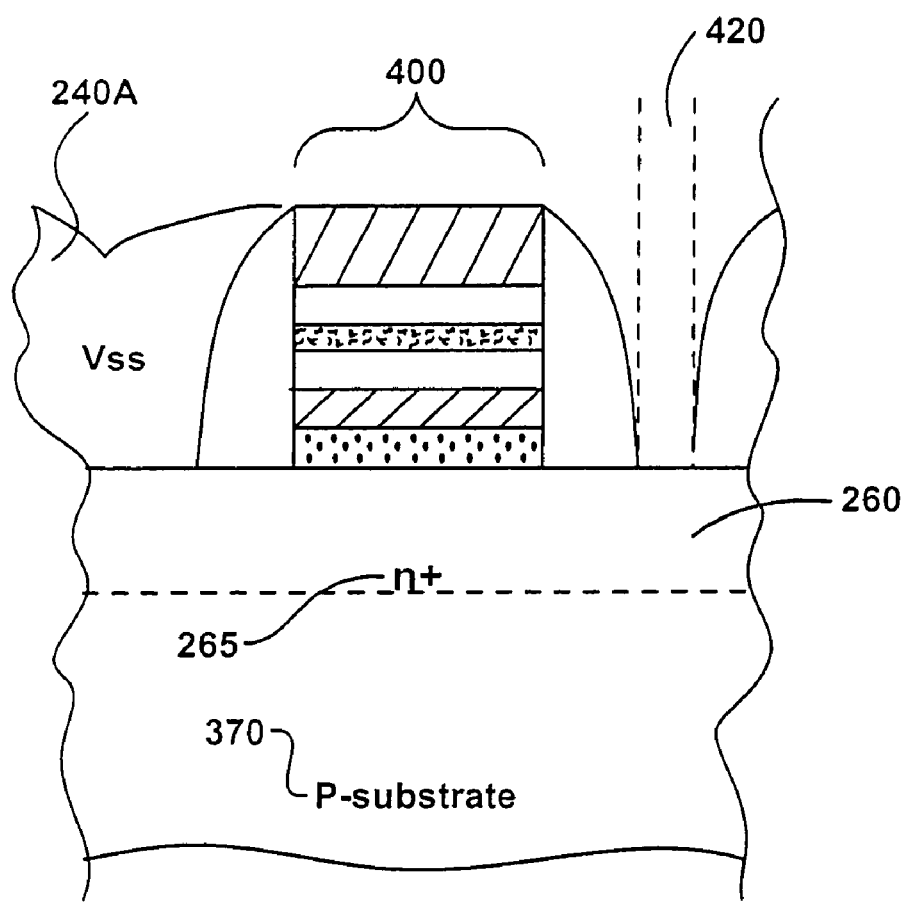
FIG. 4 is a cross sectional view of the core memory array of memory cells of FIG. 2 taken along line 2B—2B illustrating the implantation of n-type dopants in the source column, in accordance with one embodiment of the present invention.

FIG. 4 is a cross sectional diagram of the array 200 of memory cells taken along line 2B—2B of FIG. 2, in accordance with one embodiment of the present invention. FIG. 4 illustrates the formation of a stacked gate structure 400 over the source column 260 designated by the n-type dopants as shown in FIG. 4.

Additionally, FIG. 4 illustrates the formation of a complete stacked gate structure (e.g., including tunnel oxide, floating gate, ONO insulating layer, and control gate) that is formed in the fabrication process of the array 200; however, the stacked gate structure in FIG. 4 is inactive, since there is no formation of isolated source and drain regions. Also, in other embodiments the stacked gate structure may or may not include all the components of the stacked gate structure as shown in FIG. 4 for various fabrication and performance reasons.

Also, FIG. 4 illustrates the source column 260 with the implantation of the n-type dopants (e.g., n$^+$ dopants) over a p-type substrate 370, in accordance with one embodiment of the present invention. A $V_{ss}$ or common source line 240A is permanently coupled to the source column 260. In addition, a source contact 420 is formed and coupled to the source column 260, as shown in FIG. 4. The source column 260 provides for electrical coupling between the source contact 420 and the common source line 240A.

Figure 5:
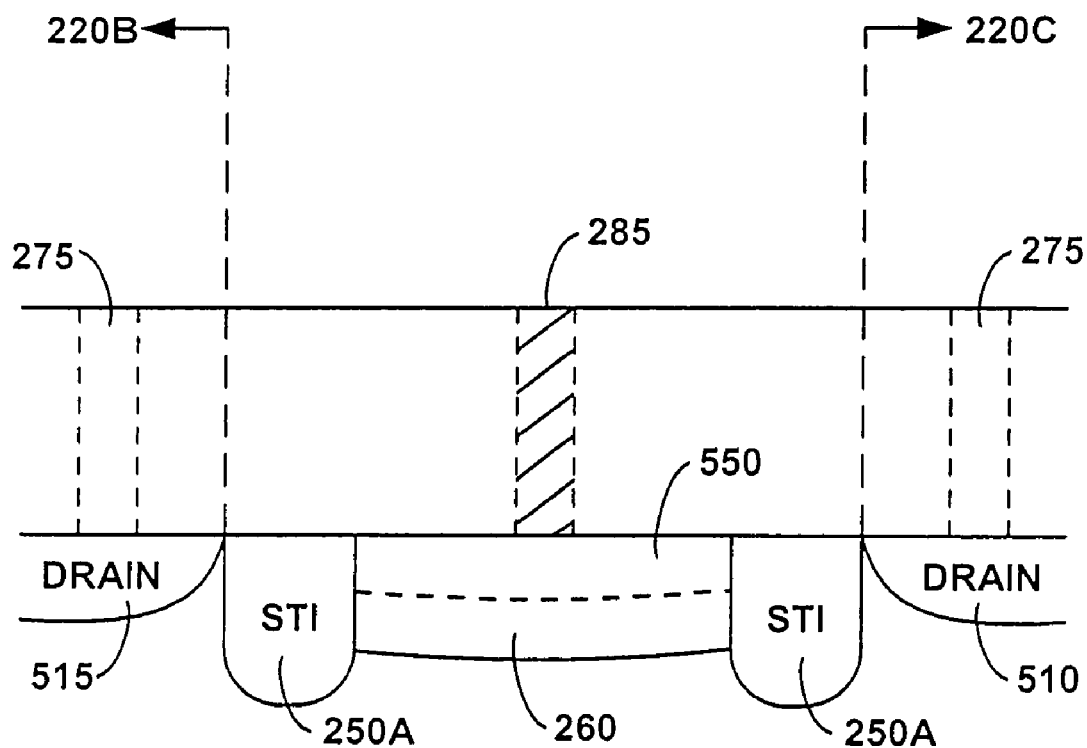
FIG. 5 is cross sectional view of the core memory array of memory cells of FIG. 2 taken along line 2C—2C illustrating the formation of the source contact along a row of drain contacts, in accordance with one embodiment of the present invention.

FIG. 5 is a cross sectional diagram of the array 200 of memory cells taken along line 2C—2C of FIG. 2, in accordance with one embodiment of the present invention. FIG. 5 illustrates the formation of a region 500 in the array 200 of memory cells that spans across three columns (column 220B, 220C and source column 260).

FIG. 5 illustrates the formation of the source contact 285 along the row of drain contacts 270B in the associated row of memory cells 210B. In one embodiment, FIG. 5 illustrates that the source contact 285 is of similar dimensions to the drain contacts 275.

In addition, STI regions of the pair 250A of STI regions isolate two columns of memory cells (220B and 220C). Drain regions 510 and 515 are shown of memory cells in the columns 220B and 220C, respectively, of memory cells. A source column 260 is shown isolated between the pair 250A of STI regions.

Also, a drain-like implanted region 550 is shown under the source contact 285, in one embodiment. The drain-like implanted region 550 is formed simultaneously with the formation of all drain regions in the core memory cell (e.g., drain region 510 and drain region 515) for process simplicity. As such, the drain-like implanted region 550 is of similar doping concentration and depth as the drain region 510 and drain region 515. In addition, in one embodiment, the doping concentration of the drain-like implanted region 550 is similar to the doping concentration of the source column 260.

Figure 6:
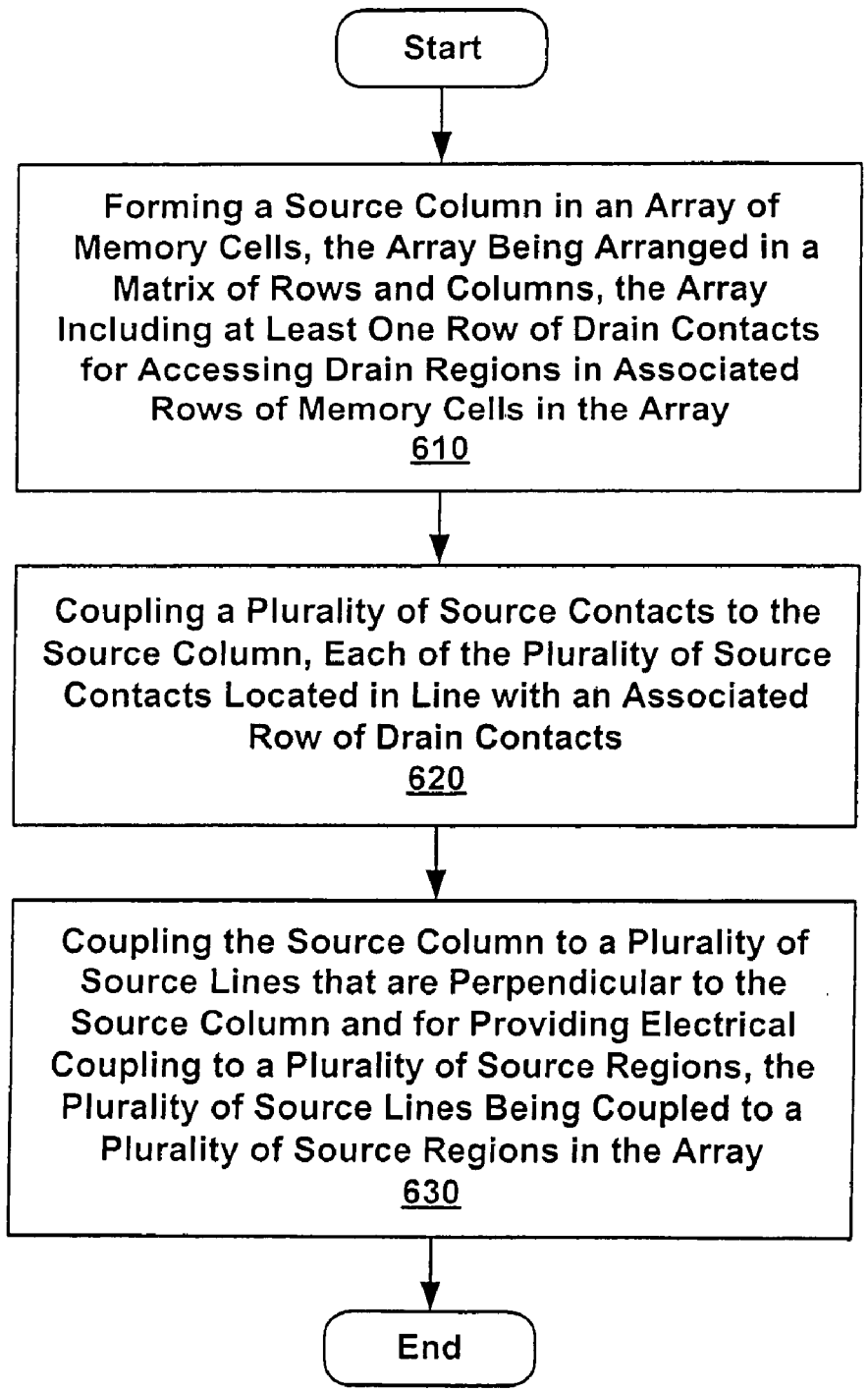
FIG. 6 is a flow chart illustrating steps in a method for the fabricating a memory device including a core array of memory cells with source line connections that facilitate straight word lines, in accordance with one embodiment of the present invention.

FIG. 6 is a flow chart 600 illustrating steps in a method for forming a source line contact in a non-volatile memory, in accordance with one embodiment of the present invention. The present embodiment begins by forming a source column in an array of memory cells, in step 610. The array of memory cells being arranged in a matrix of rows and columns. In other words, the memory cells in the array are arranged in a matrix of rows and columns.

The source column is formed by implanting n-type dopants between two STI regions that isolate columns of memory cells, and the source columns. The n-type dopants are also implanted under a plurality of word lines in the array of memory cells, and before the formation of the plurality of word lines.

The array of memory cells includes at least one row of drain contacts. The row of drain contacts accesses drain regions in an associated row of memory cells in the array of memory cells. A plurality of rows of drain contacts accesses drain regions in a plurality of rows of memory cells in the array of memory cells.

In step 620, the present embodiment couples a plurality of source contacts to the source column. Each of the plurality of source contacts is located in line with a selected row of drain contacts. As such, each of the source contacts is formed similarly and using the same fabrication steps used for forming the drain contacts in the selected row of drain contacts.

By locating the source contacts along a line of drain contacts in associated rows of drain contacts, a plurality of word lines can be formed without any bending in the word lines to accommodate for source contacts that are larger than the source line. The word lines in the array of memory cells are formed perpendicular to the source column.

In step 630, the present embodiment couples the source column to a plurality of source lines. Each of the plurality of source lines is formed perpendicular to the source column. In addition, the plurality of source lines is coupled to a plurality of source regions in the array of memory cells. As such, the source column provides for electrical coupling between the plurality of source contacts and the plurality of source regions in memory cells in the array of memory cells. In one embodiment, the plurality of source lines is a plurality of common source lines.

Figure 7:
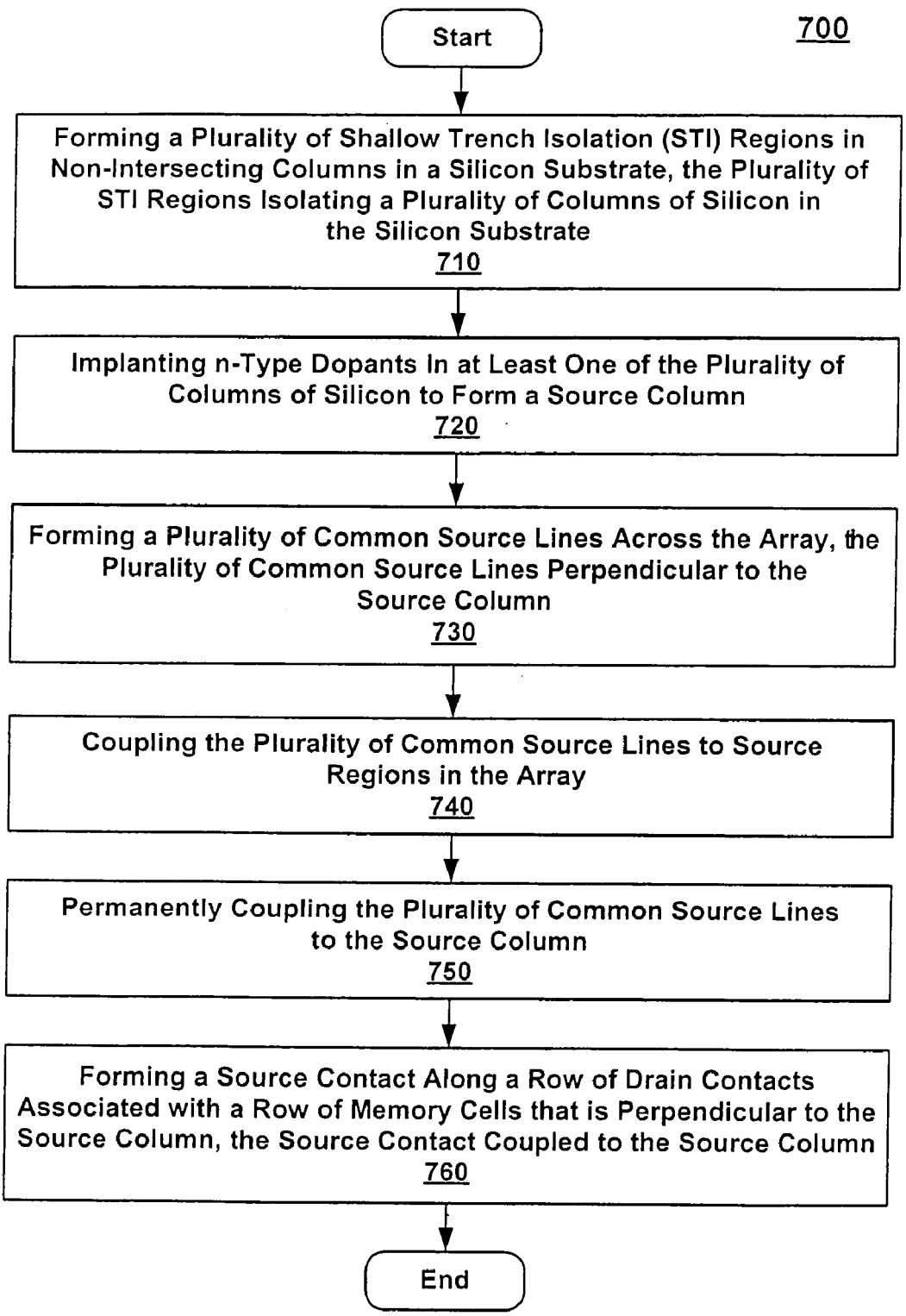
FIG. 7 is a flow chart illustrating steps in a method for the fabrication of a source column in a core array of memory cells with source line connections that facilitate straight word lines, in accordance with one embodiment of the present invention.

FIGS. 7 and 8A–D illustrate the fabrication steps implemented to form a source line contact in an array of memory cells that does not require any word line bending, in accordance with one embodiment of the present invention. FIG. 7 is a flow chart 700 of steps in a method for forming the source line contact in an array of memory cells that does not require any word line bending. FIGS. 8A–D are a diagrams illustrating the fabrication steps implemented to form the source line contact as disclosed in flow chart 700.

Referring now to FIG. 7, the present embodiment begins by forming a plurality of STI regions in non-intersecting columns in a silicon substrate, in step 710. The plurality of STI regions isolates a plurality of columns of silicon in the silicon substrate.

Figure 8A:
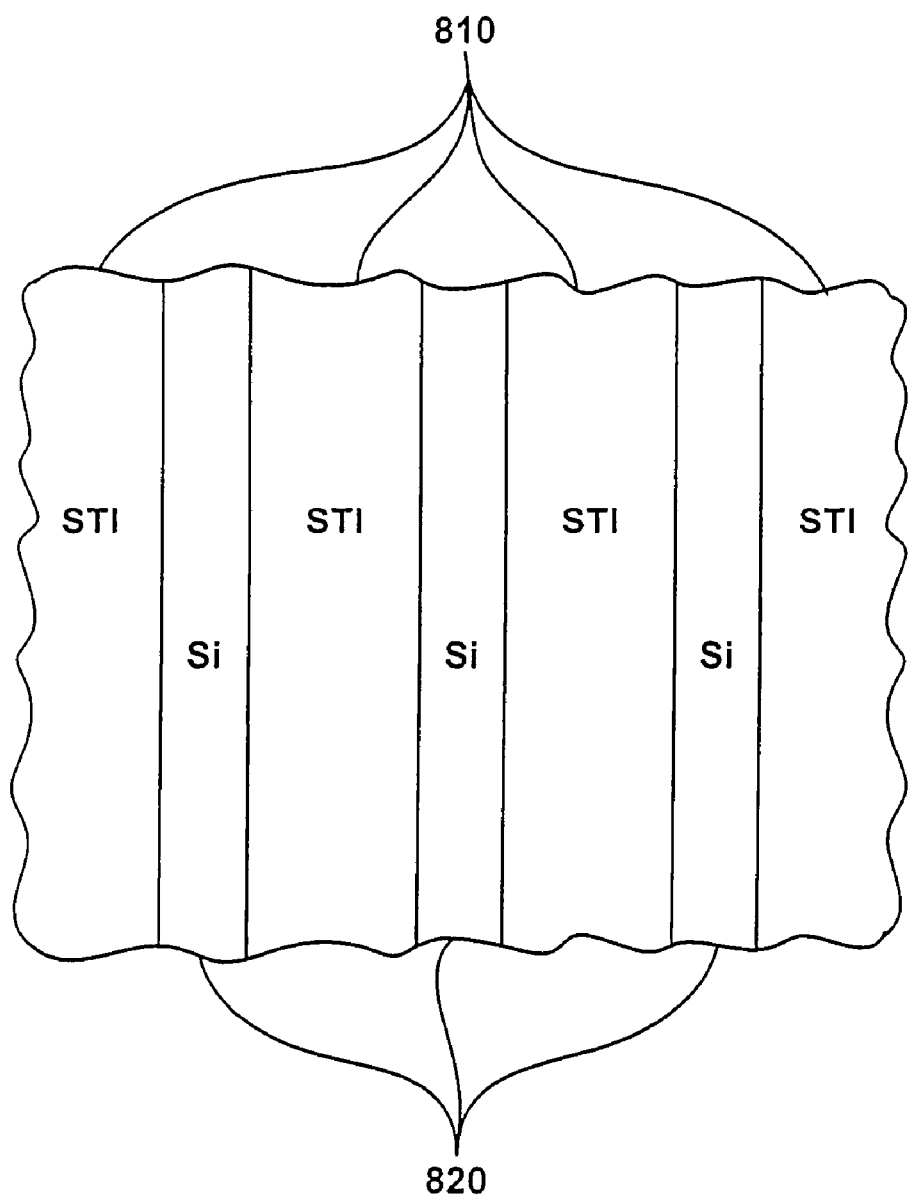
FIGS. 8A–8D are diagrams illustrating the fabrication steps as outlined in FIG. 7 for the fabrication of a source column in a core array of memory cells with source line connections that facilitate straight word lines, in accordance with one embodiment of the present invention.

FIG. 8A illustrates the formation of the plurality of STI regions 810 in a silicon substrate. The plurality of STI regions 810 isolates a plurality of columns of silicon 820 in the substrate.

Flow chart 700 then proceeds to step 720, where the present embodiment implant n-type dopants in at least one of the plurality of columns of silicon to form a source column. The remaining columns of silicon will later form respective source, drain, and stacked gate regions of memory cells.

Figure 8B:
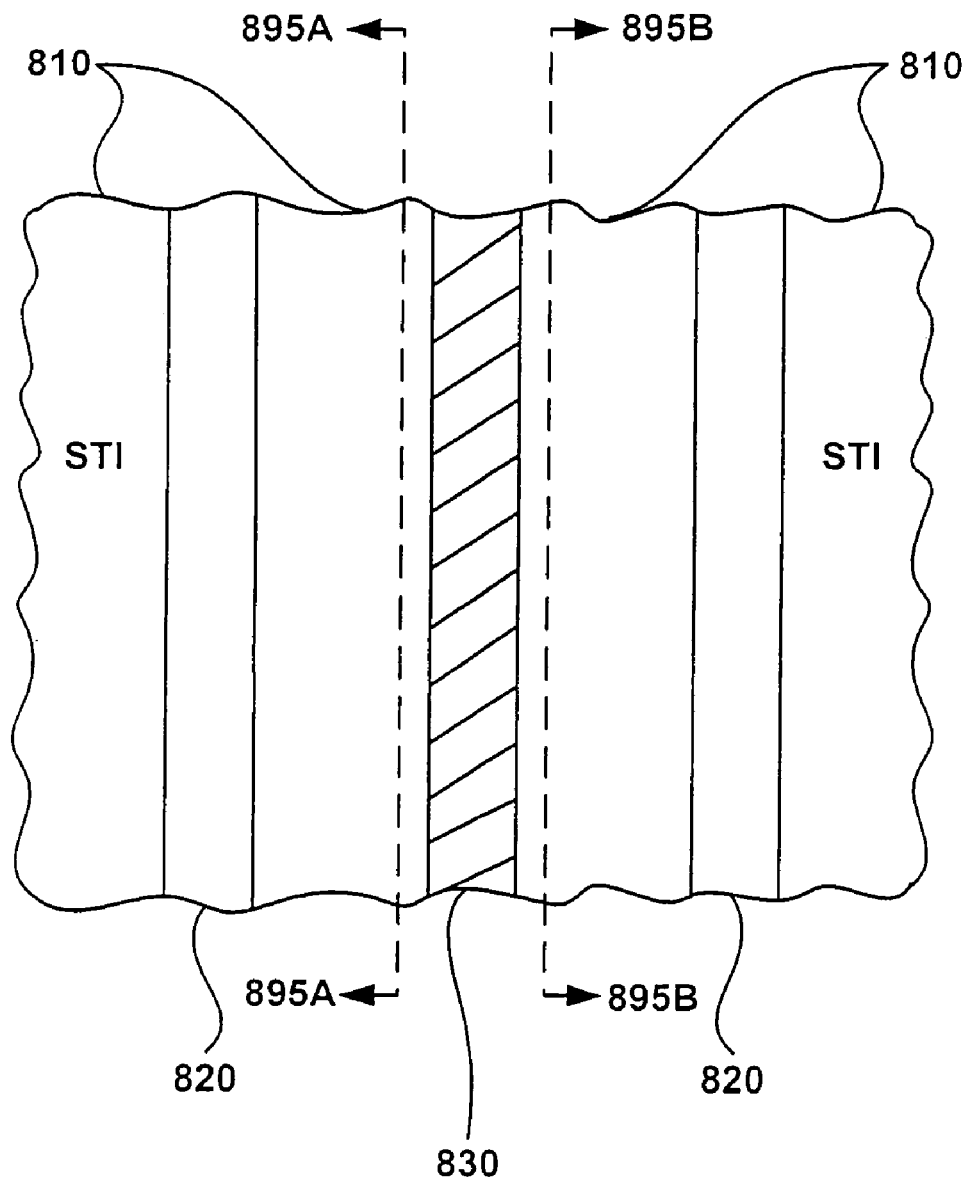

FIG. 8B is a diagram illustrating the formation of the source column as described in step 720, in accordance with one embodiment. The implantation of n-type dopants in the source column can be accomplished by depositing a photoresist layer as outlined by lines 895A—895A and 895B—895B. The photoresist layer exposes the source column 830 where n-type dopants can be implanted in any method suitable for implanting n-type dopants into the selected source column 830.

After implantation of the n-type dopants in the source column 830, the photoresist layer can be removed, whereupon the remaining fabrication steps for forming a typical core memory array can be followed. As such, the formation of the source column only requires the additional steps of masking, implantation, and removing the mask layer, as implemented in current fabrication techniques.

Figure 8C:
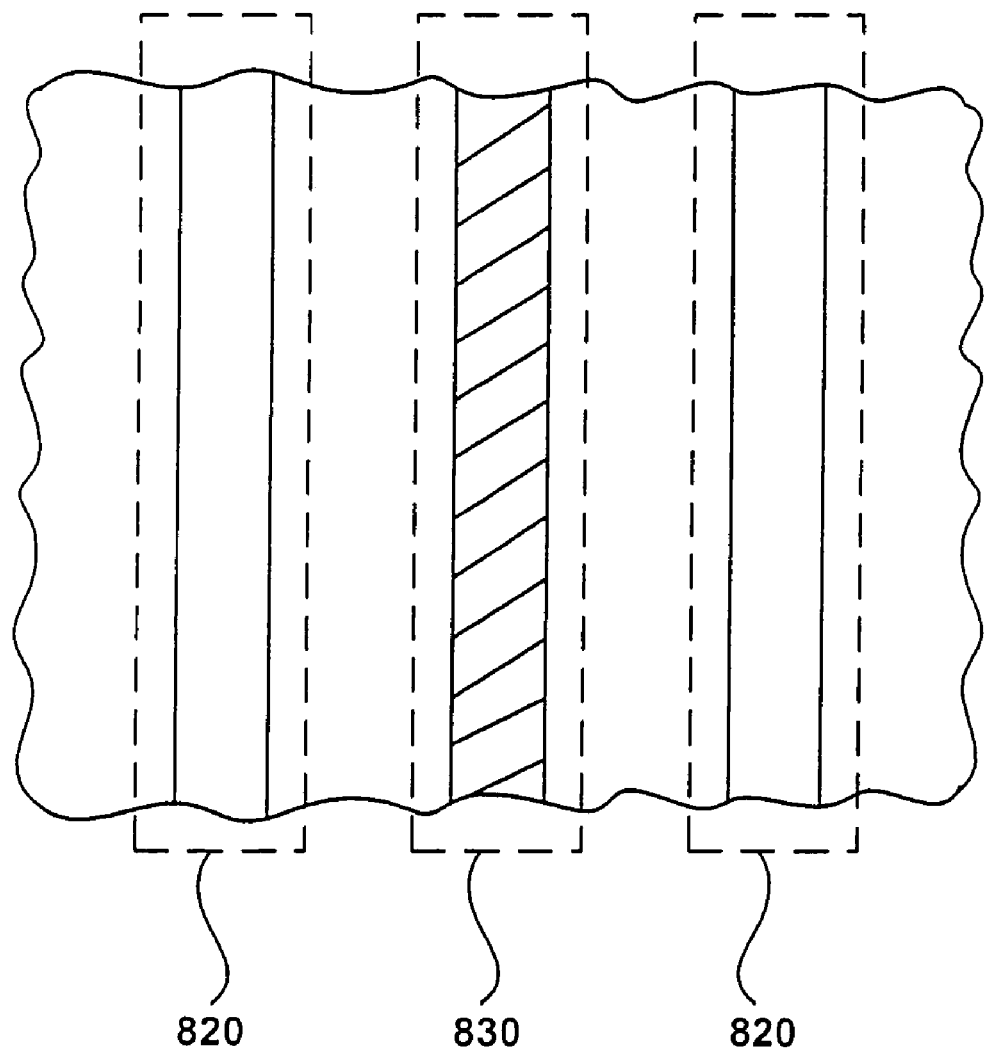
Figure 8D:
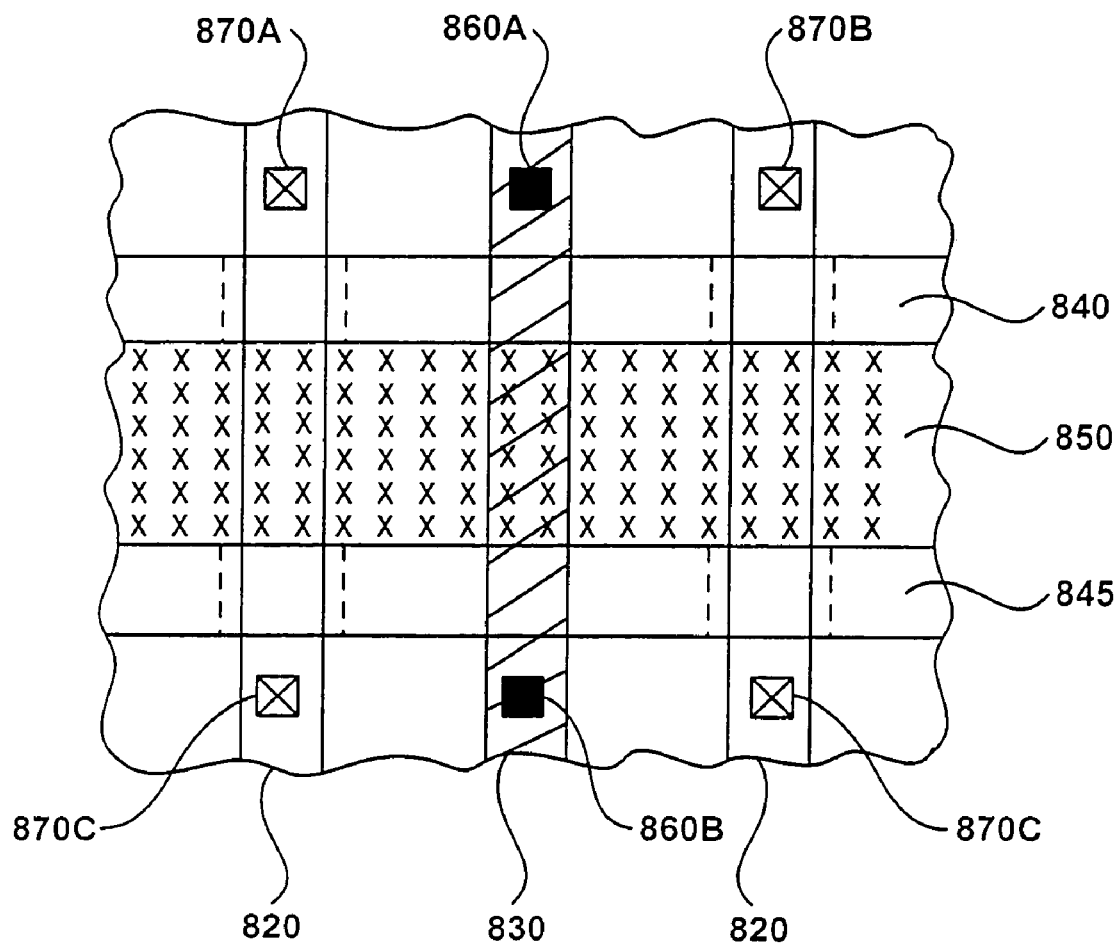

FIGS. 8C and 8D illustrate the remaining fabrication steps for the formation of the array of memory cells. In FIG. 8C, portions of the stacked gate region (e.g., the tunnel oxide, floating gate, and ONO layers) of each of the memory cells in the array of memory cells is formed. Formation of these stacked gate regions is illustrated by the dotted lines surrounding the silicon columns 820 and the source column 830. FIG. 8C illustrates that the formation of the stacked gate region occurs over the source column, in one embodiment.

Although the present embodiment discloses the formation of the source column immediately after the formation of the STI regions and at the beginning of the fabrication process, other embodiments are well suited to the formation of the source column at a later stage of the fabrication process. In one embodiment, the source column is formed after formation of the wordlines. In this embodiment, the source column implant is performed to diffuse the n-type dopants of the source column implant under the wordlines in order to form a continuous column.

Returning back to FIG. 7, the present embodiment forms a plurality of common source lines across the array, in step 730. Each of the plurality of common source lines is formed perpendicular to the source column. Prior to the formation of the common source lines, the source and drain regions in the columns of silicon of associated memory cells of the array are formed.

In step 740, the present embodiment couples the plurality of common source lines to source regions of memory cells in the array of memory cells. In step 750, the plurality of common source lines is permanently coupled to the source column. In this way, an electrical coupling is formed between the source column and each of the source regions in the array of memory cells.

In step 760, the present embodiment forms a source contact along a row of drain contacts. The row of drain contacts is associated with a row of memory cells that is formed perpendicular to the source column. In addition, the source contact is coupled to the source column.

Thereafter, the present embodiment forms a plurality of control gates on the ONO interpoly dielectric layers in the form of a plurality of word lines. The plurality of word lines are non-intersecting across the array of memory cells. These plurality of word lines exhibit straightness at intersections with the source column that are adjacent to said source contact.

FIG. 8D is a diagram illustrating steps 730–760 of FIG. 7, in accordance with one embodiment of the present invention. FIG. 8D illustrates the formation of the word lines 840 and 845 that are associated with two rows of memory cells in the array of memory cells. In addition, a common source line 850 is coupled to a shared source region between the two rows of memory cells associated with the word lines 840 and 845.

FIG. 8D also illustrates the formation of the contacts to the drain regions of the memory cells in the array, and to the source column 830. The source contacts 860A and 860B are formed in line with a row of drain contacts. For example, the source contact 860A is formed simultaneously and in-line with the source contacts 870A and 870B. In addition, the source contact 860B is formed simultaneously and in-line with the source contacts 870C and 870D. In that way, the word lines need not be altered to accommodate for the formation of source contacts (e.g., when forming source contacts in-line with the common source line).

The preferred embodiments of the present invention, an apparatus comprising an array of flash memory cells with a source line connection that facilitates straight word lines, and a method for producing the same, is thus described. While the present invention has been described in particular embodiments, it should be appreciated that the present invention should not be construed as limited by such embodiments, but rather construed according to the below claims.

What is claimed is:

1. A non-volatile semiconductor memory device including an array of memory cells, said array of memory cells comprising:
   a source column implanted with n-type dopants, said source column coupled to a plurality of common source lines that are coupled to a plurality of source regions of memory cells in said array of memory cells, said source column arranged perpendicular to each of said plurality of common source lines; and
   a source contact coupled to said source column for providing electrical coupling with said plurality of source regions, said source contact located along a row of drain contacts coupled to drain regions of a row of memory cells that are arranged perpendicular to said source column, and wherein said source contact is of different dimension than each drain contact of said row of drain contacts.

2. The non-volatile semiconductor memory device as described in claim 1, further comprising:
   a plurality of word lines coupled to control gate regions of memory cells in said array of memory cells, said plurality of word lines exhibiting straightness at intersections with said source column adjacent to said source contact.

3. The non-volatile semiconductor memory device as described in claim 1, further comprising:
   a plurality of STI regions arranged in non-intersecting columns on a silicon substrate, said plurality of STI regions isolating columns of memory cells in said array of memory cells, and isolating said source column.

4. The semiconductor memory device as described in claim 1, wherein memory cells in said array of memory cells are arranged in a NOR configuration.

5. The semiconductor memory device as described in claim 1, wherein at least one of said array of memory cells is a flash memory cell comprising:
   a tunnel oxide layer formed on a semiconductor substrate between source and drain regions;
   a floating gate formed on said tunnel oxide layer;
   a multi-level insulating layer formed on said floating gate; and
   a control gate formed on said insulating layer.

6. The semiconductor memory device as described in claim 1, further comprising
   a second source contact strapped to said source column for reducing resistance in said plurality of common source lines, and located along a second row of drain contacts that are coupled to drain regions of a second row of memory cells.

7. The semiconductor memory device as described in claim 1, further comprising:
   a second source column implanted with said n-type dopants, said source column coupled to said plurality of common source lines, said second source column located x columns of memory cells from said source column for reducing resistance in said plurality of common source lines.

* * * * *